United States Patent
Patel et al.

(10) Patent No.: US 6,968,110 B2
(45) Date of Patent: Nov. 22, 2005

(54) CMOS-COMPATIBLE INTEGRATION OF SILICON-BASED OPTICAL DEVICES WITH ELECTRONIC DEVICES

(75) Inventors: Vipulkumar Patel, Monmouth Junction, NJ (US); Margaret Ghiron, Allentown, PA (US); Prakash Gothoskar, Allentown, PA (US); Robert Keith Montgomery, Easton, PA (US); Kalpendu Shastri, Orefield, PA (US); Soham Pathak, Allentown, PA (US); Katherine A. Yanushefski, Zionsville, PA (US)

(73) Assignee: SiOptical, Inc., Allentown, PA (US)

( * ) Notice: Subject to any disclaimer, the term of this patent is extended or adjusted under 35 U.S.C. 154(b) by 10 days.

(21) Appl. No.: 10/828,898

(22) Filed: Apr. 21, 2004

(65) Prior Publication Data

US 2004/0207016 A1 Oct. 21, 2004

Related U.S. Application Data

(60) Provisional application No. 60/464,491, filed on Apr. 21, 2003.

(51) Int. Cl.[7] .............................................. G02B 6/10
(52) U.S. Cl. ....................................... 385/131; 257/431
(58) Field of Search .......................... 385/131; 257/431

(56) References Cited

U.S. PATENT DOCUMENTS

| | | | |
|---|---|---|---|
| 6,284,629 B1 | 9/2001 | Yokokawa et al. | |
| 6,613,638 B2 | 9/2003 | Ito | |
| 6,653,209 B1 | 11/2003 | Yamagata | |
| 6,671,443 B2 * | 12/2003 | Deliwala | 385/125 |
| 6,673,640 B2 | 1/2004 | Naruoka | |
| 6,813,431 B2 * | 11/2004 | Davids et al. | 385/129 |
| 2004/0063298 A1 | 4/2004 | Aga et al. | |

\* cited by examiner

*Primary Examiner*—Douglas Wille (57) ABSTRACT

A conventional CMOS fabrication technique is used to integrate the formation of passive optical devices and active electro-optic devices with standard CMOS electrical devices on a common SOI structure. The electrical devices and optical devices share the same surface SOI layer (a relatively thin, single crystal silicon layer), with various required semiconductor layers then formed over the SOI layer. In some instances, a set of process steps may be used to simultaneously form regions in both electrical and optical devices. Advantageously, the same metallization process is used to provide electrical connections to the electrical devices and the active electro-optic devices.

46 Claims, 5 Drawing Sheets

CMOS-COMPATIBLE INTEGRATION OF SILICON-BASED OPTICAL DEVICES WITH ELECTRONIC DEVICES

CROSS REFERENCE TO RELATED APPLICATION

This application claims the benefit of Provisional Application Ser. No. 60/464,491, filed Apr. 21, 2003.

TECHNICAL FIELD

The present invention relates to conventional CMOS-compatible fabrication techniques for silicon-based optical devices and, more particularly, to the use of CMOS-compatible fabrication techniques that allows for the integration of conventional CMOS electronic devices with silicon-based passive optical devices and active electro-optic devices in the silicon-on-insulator (SOI) structure.

BACKGROUND OF THE INVENTION

Integrated circuits may be fabricated on silicon-on-insulator (SOI) substrates (as compared with bulk silicon substrates) to achieve higher device speeds and/or lower power dissipation. The SOI structure comprises a silicon substrate, a buried dielectric layer (for example, silicon dioxide) and a relatively thin (e.g., sub-micron) single crystal silicon surface layer, where this surface layer is typically referred to as the "SOI" layer.

In the optical regime, an SOI layer can be used as the waveguiding layer for infrared wavelengths (1.1 $\mu$m–5.0 $\mu$m) for which silicon is nearly transparent. By forming reflecting, confining or transmitting boundaries in the waveguiding layers, passive optical devices (e.g., mirrors, rib waveguides, lenses, gratings, etc.) can be realized. In addition, the same free carriers (electrons and holes) that are used for the electronic functionality in integrated circuits can be used to actively manipulate light in silicon. The injection or removal of free carriers in silicon affects both the real and imaginary index of the waveguide and causes a phase shift/absorption of the light traveling through the waveguide. When properly designed and combined with the confinement of light in a silicon waveguide, an electronic device can modify the optical properties of the waveguide, thus affecting the optical mode. As a result, SOI technology offers a powerful platform for the monolithic integration of electrical, passive optical and active electro-optical devices on a single substrate.

In order to leverage the infrastructure and expertise that has been developed for the fabrication of electronic devices in an SOI platform, passive optical and active electro-optical devices must be fabricated using the same thin SOI layer that is used for fabricating electronic devices. Hence, the ability to efficiently couple light into a relatively thin SOI layer, guide light with low loss and achieve active manipulation (i.e., modulation and detection) of light at high speeds needs to be accomplished without significantly affecting the performance of the conventional electronic circuits. To enable leveraging of the investment, infrastructure and discipline in the developed silicon integrated circuit industry, the device structure and fabrication methods for optical and electro-optical devices must be compatible with the advancements in the integrated circuit industry.

For realization of high performance, SOI-based electronic devices, several device architectures (e.g., partially-depleted CMOS, fully-depleted CMOS, BiCMOS, etc.) are well-known in the art and are currently being used in high volume production of advanced integrated circuits.

Figure 1:
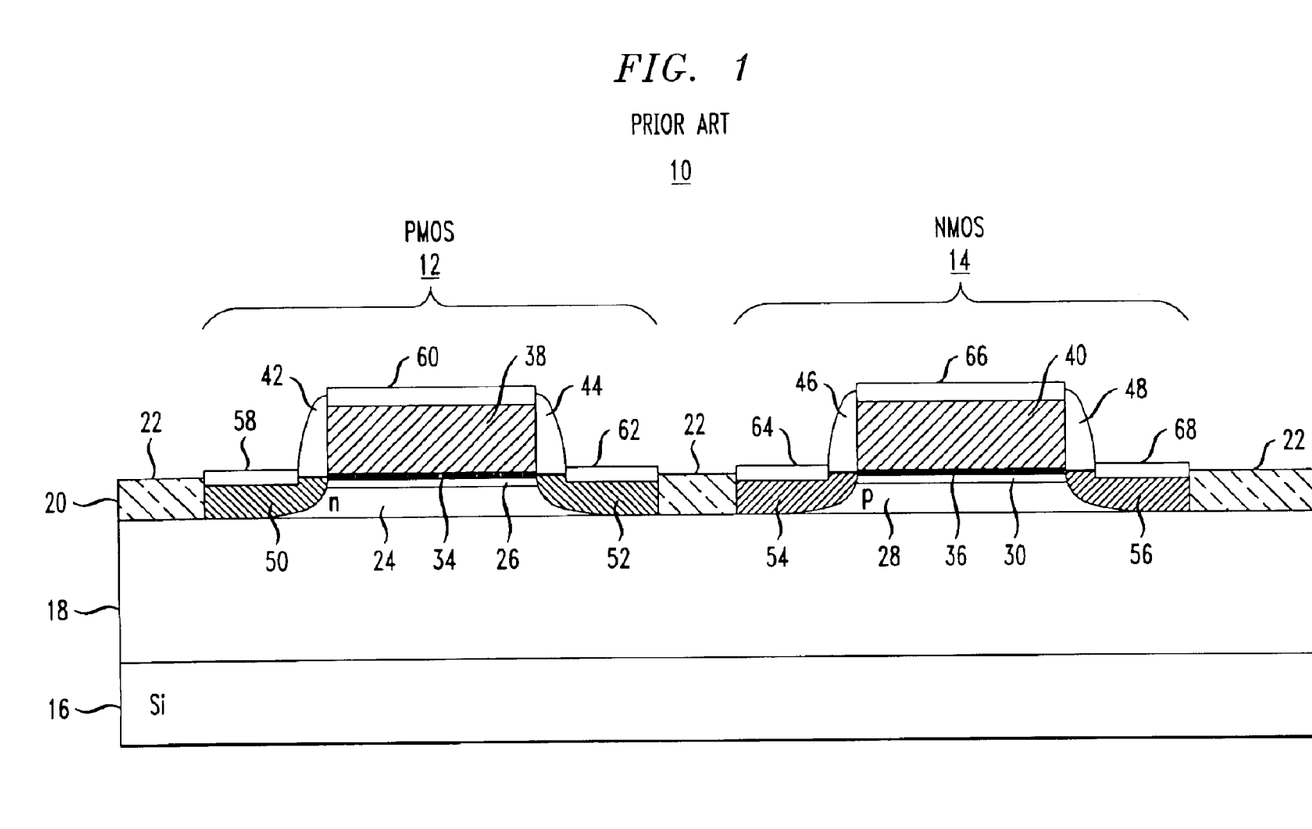
FIG. 1 illustrates an exemplary prior art CMOS device, comprising a PMOS and an NMOS transistor.

FIG. 1 illustrates an exemplary prior art SOI-based CMOS device 10. As is well known, a CMOS device contains a PMOS (P-channel) transistor 12 and an NMOS (N-channel) transistor 14. The SOI structure comprises a silicon substrate 16, a buried dielectric layer 18 and a relatively thin SOI layer 20. Electrical isolation between PMOS transistor 12 and NMOS transistor 14 is achieved by removing the portions of SOI layer 20 in the non-transistor areas, and filling these areas with a dielectric insulation material, illustrated as dielectric insulating region 22 in FIG. 1.

In a conventional prior art CMOS process, the transistors may be typically formed using the following exemplary processing steps:

Doping active regions of SOI layer 20 with appropriate doping type and profile to form the body region and channel region for each device, illustrated as n-type body region 24 and p-channel region 26 for PMOS transistor 12 and p-type body region 28 and n-channel region 30 for NMOS transistor 14.

Forming a thin gate dielectric layer to cover channel regions 26 and 30, where if an oxide is used, a thermal process in employed to grow the layer, the dielectric layer forming a PMOS transistor gate dielectric 34 and an NMOS transistor gate dielectric 36.

Depositing, doping and patterning a silicon (typically in the form of polysilicon) layer to form a PMOS transistor gate region 38 and an NMOS transistor gate region 40.

Forming sidewall spacers 42 and 44 on either side of PMOS transistor gate region 38, and sidewall spacers 46 and 48 on either side of NMOS transistor gate region 40.

Forming self-aligned source and drain regions (by virtue of the sidewall spacers), using photolithography/ion implantation, forming p+ drain and source regions 50 and 52 for PMOS transistor 12 and n+ drain and source regions 54 and 56 for NMOS transistor 14.

Forming silicide on the electrical contact areas, illustrated as silicide contacts 58, 60 and 62 for PMOS transistor 12 and silicide contacts 64, 66 and 68 for NMOS transistor 14.

Figure 4:
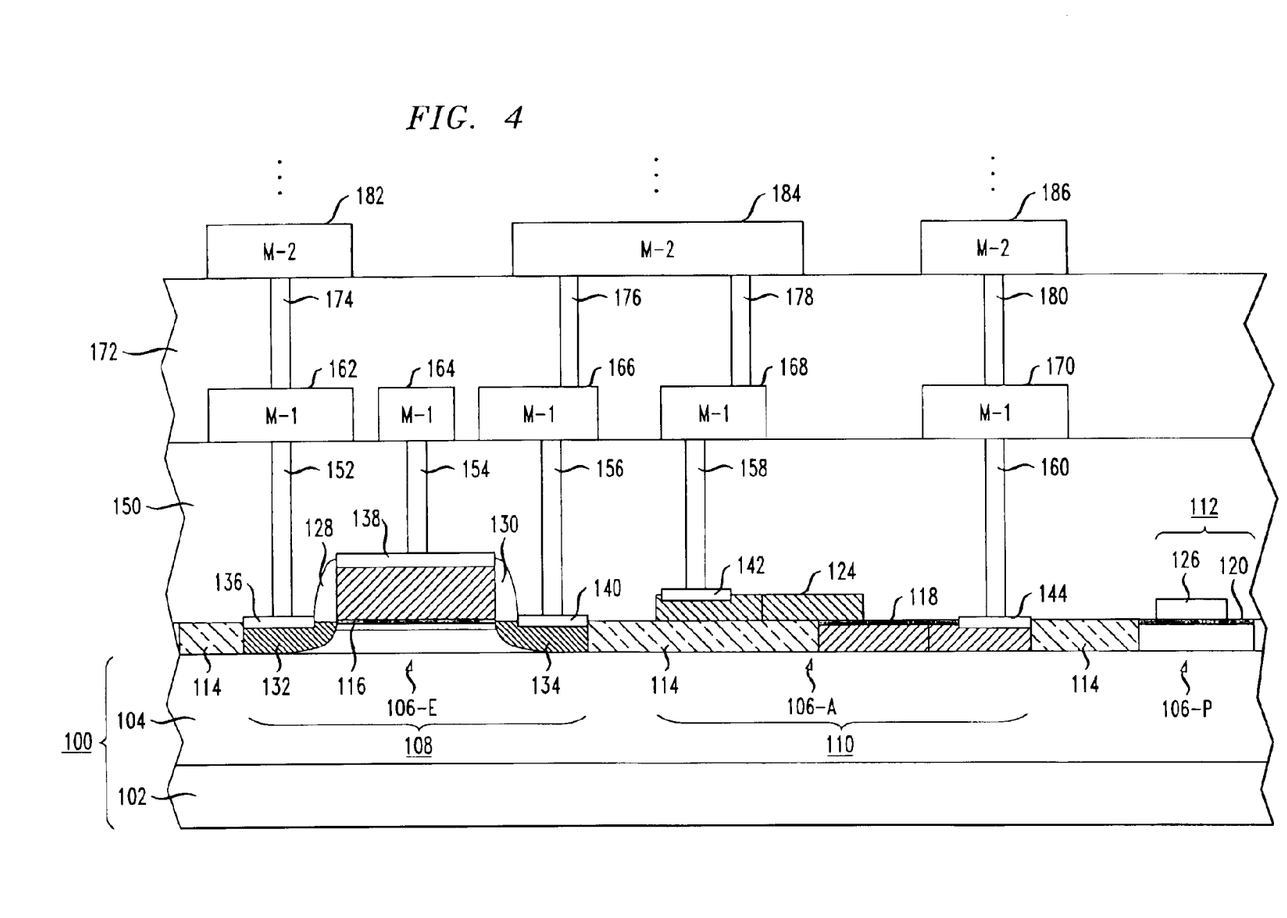
FIG. 4 is an illustration of the same arrangement as FIG. 3, including the utilization of a common set of metallization layers to provide electrical connection to the electrical devices and active electro-optical devices.

Forming final contact and multi-level metallization structures (illustrated in FIG. 4 and discussed hereinbelow).

It is to be noted that the above process description is considered to be exemplary only, showing a commonly used NMOS and PMOS transistor device structure (the basic elements used in CMOS technology) and a generalized processing sequence for making the CMOS device. Depending upon the technology (CMOS, BiCMOS, etc.) and the fabrication facility being used, a large variety of transistor structures can be fabricated using several different processing sequences.

In MOS transistors, a channel region (such as channel regions 26 and 30 in FIG. 1) is formed by applying appropriate voltages to the silicide contacts of the source, drain and gate regions of the transistor. The conductance of the channel region, and thus the current flowing between the source and the drain is modulated by modulating the gate voltage. In order to minimize the resistance associated with the gate region, the polysilicon material is heavily doped with appropriate impurities to achieve "metal-like" electrical properties.

The prior art describes fabrication of electro-optic devices using a relatively thick SOI layer (e.g., a few microns thick). Use of a thick SOI layer limits the optical waveguide and electro-optic devices to be multi-mode, making it difficult to optimally use the free carrier-based electro-optic effect for manipulation of light. Further, due to the bulk-like silicon region formed in the thick SOI layer, the high speed and low power aspects of conventional SOI CMOS electronics cannot be achieved. In addition, low resolution, non-conventional processes such as Deep reactive ion etching (RIE) are needed for definition of optical devices, and the resultant topology limits the use of conventional planarization and multi-level metallization processes, further limiting the realization of high performance electronics in combination with electro-optic devices on the same substrate.

SUMMARY OF THE INVENTION

The needs remaining in the prior art are addressed by the present invention, which relates to the use of CMOS-compatible fabrication techniques that allow for the integration of conventional CMOS electronic devices with silicon-based passive optical devices and active electro-optic devices in a common SOI wafer.

In accordance with the present invention, a wafer-scale testing is first performed to determine the quality of the SOI wafer before beginning any device fabrication, thus greatly reducing the possibility of optical defects affecting optical performance and device yield. Once the wafer has been "qualified" (from both an optical and electrical defect point of view), the various layers associated with the electrical, passive optical, and active electro-optical components are formed using conventional CMOS processing steps. In one embodiment of the present invention, the various regions of the electrical devices are formed simultaneously with the optical components.

In another embodiment of the present invention, a common dielectric and a common silicon layer is used for formation of electrical, passive optical and active electro-optical devices. Different regions of the common silicon layer are doped differently to achieve "metal-like" gate region for electrical, "semiconductor-like" silicon region for active electro-optic devices and "dielectric-like" silicon region for passive optical devices.

In yet another embodiment of the present invention, the thin dielectric and the optical silicon layers associated with the passive optical components and active electro-optical components are first formed over an SOI substrate. The dielectric and silicon layers associated with the electrical components are then formed in other regions of the same SOI substrate.

One significant aspect of the present invention is the use of a common set of dielectric isolation layers, contact and via openings and metallization layers that are formed to connect various regions of the optical and electrical components. Openings for bringing optical input signals to the SOI layer are formed as the last step in the process.

Various other arrangements and attributes of the present invention will become apparent during the course of the following discussion, and by reference to the accompanying drawings.

BRIEF DESCRIPTION OF THE DRAWINGS

Referring now to the drawings, where like numerals represent like parts in several views.

DETAILED DESCRIPTION

As mentioned above, the present invention discloses a CMOS-compatible processing scheme for the fabrication of planar optical and electro-optical devices with conventional CMOS electronic devices, without significantly altering the performance of high speed/low power CMOS transistors/circuits and with high yields.

As optical and electro-optic devices have begun to be developed in a sub-micron thick SOI layer, a phenomena hereinafter referred to as "streaking" has been seen by the inventors in certain samples. In general terms, "streaking" occurs when a light beam propagating along a sub-micron SOI layer encounters an optical defect of some sort. The defect perturbs the local effective refractive index of the waveguide and results in scattering, and sometimes in an interference pattern that degrades the performance of the formed optical components.

The majority of defects that impact the optical performance of an SOI wafer (e.g., physical defects causing optical scattering) have been found to be smaller in size than the defects associated with impacting electrical performance. Additionally, these optical defects may have dimension much smaller than the thickness of the "SOI" layer and can be located anywhere across the thickness of the SOI layer (e.g. sub-surface defects) and may not be detected using conventional IC defect inspection tools. Thus, a wafer that would allow formation of electronic components with high yield, may include a large number of small optical defects, rendering the wafer unacceptable for forming optical devices with high yield. Heretofore, SOI wafer manufacturers (and/or integrated circuit manufactures) have not experienced any need to screen for such optical defects. Now, with the integration of electronic and optical components on the same SOI wafer, there is a need for a new screening technique, so that SOI wafers exhibiting more than a threshold number of such optical defects will be rejected before any optical device fabrication has begun, thus saving the time and expense of forming an optical subsystem within an SOI wafer that will not be capable of supporting optical signal transmission.

Figure 2:
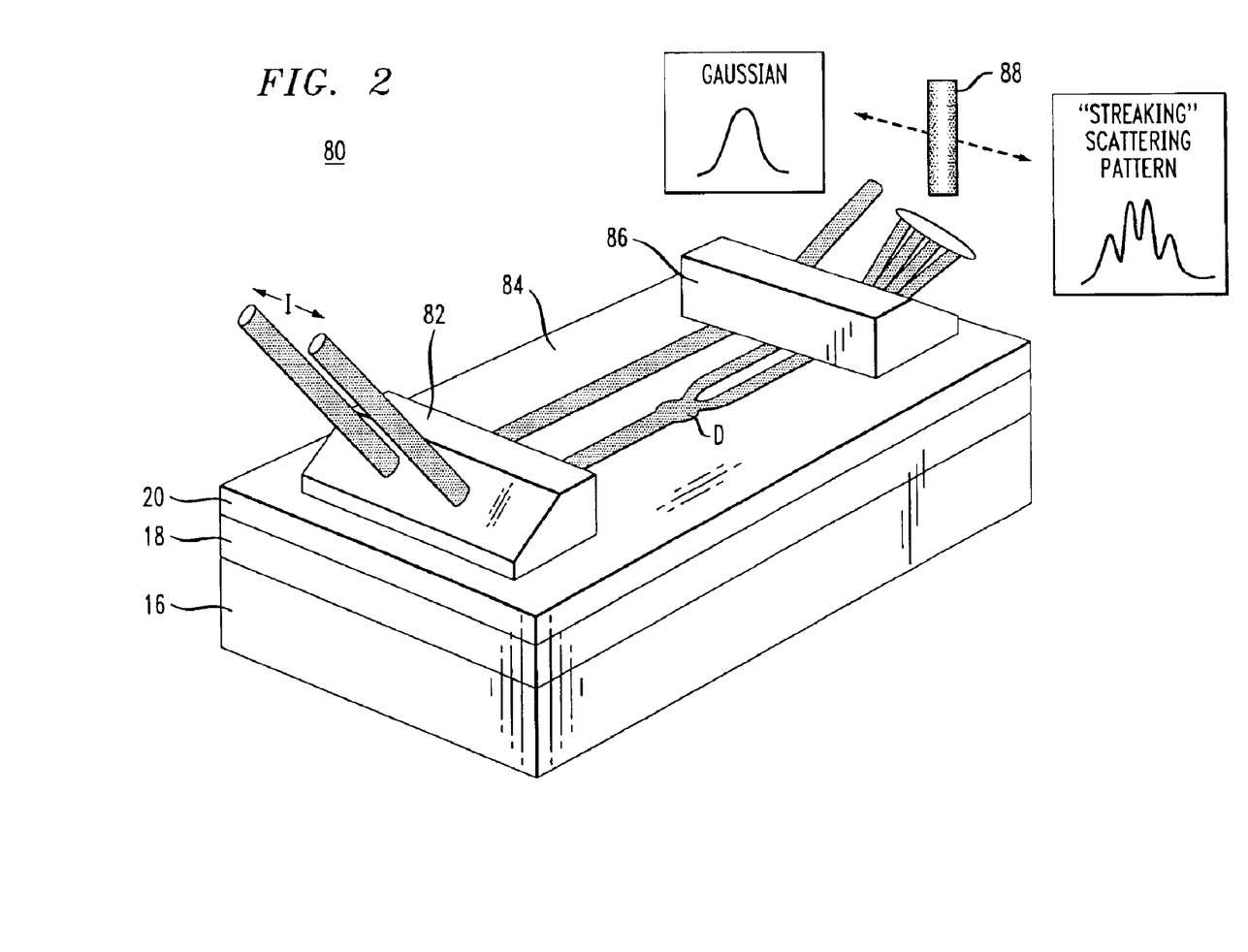
FIG. 2 is an arrangement used to detect the presence of optical defects causing streaking within a relatively thin SOI layer during the propagation of an optical signal.

An exemplary arrangement 80 for detecting these optical streaking defects is illustrated in FIG. 2. A test prism 82 is disposed on a top surface 84 of SOI layer 20 of an SOI structure being tested. A collimated input beam I is evanescently coupled through prism 82 and into SOI layer 20. The beam then propagates along SOI layer 20 and is subsequently evanescently coupled out of SOI layer 20 through an exit prism 86. A scanning slit detector 88 is disposed at the output of exit prism 86 and is used to monitor for the appearance of a "scattering" pattern in the output signal. If the shape of the output beam is distorted from its original shape (e.g. Gaussian), it may be presumed that the beam encountered a defect D along the signal path and streaking has occurred. For streaking to take place, a localized variation in the effective refractive index in the waveguide is required. Defects in the body (bulk) of SOI layer 20 can cause streaking. Additionally, defects located at the interface between SOI layer 20 and buried dielectric layer 18 can also cause streaking. Physical defects that are commonly found in SOI, such as crystal-originated-particles (COP) (0.1–0.2 $\mu$m voids—regular octahedrons surrounded by {111} planes with an inner wall covered by an oxide), dislocations, microcracks, defects related to oxygen precipitates, stacking faults, scratches, volume/surface contamination from organic materials, etc, can result in a localized change in refractive index, leading to streaking. From the shape of the output beam, the number, size and location of the optical defects can be estimated and then correlated to the physical defects. Once the relationship between the physical defect and the optical defect is established, well-developed physical defect identification methods can be used to determine the optical defect density.

Indeed, the first step in the fabrication process is to screen the SOI layer to identify wafers with a low count of optical defects, where these wafers will then improve the yield of the operable optical and electro-optic devices. Current manufacturing methods for producing SOI wafers are only optimized for reducing electrical defects. It has been found that SOI wafers with similar specifications for electrical defects can have significantly different numbers of optical-related defects, where the number of optical-related defects has been found to depend more on the method of manufacturing used to create the SOI wafer. For example, an SOI layer prepared using an epitaxial growth process (as compared with bulk crystal formation methods) appears to have a lower density of optical defects per unit area. Also, the use of hydrogen annealing (for example, surface annealing/smoothing in hydrogen at 1150° C. at 80 Torr for approximately one hour) to polish the surface of the SOI layer seems to produce less optical defects as compared with the use of a Chemical Mechanical Polishing (CMP) method for polishing the SOI layer surface.

To leverage the wafer inspection infrastructure of the IC industry, it is envisioned that the high volume/high throughput surface light scattering inspection tools will be modified to allow for non-destructive inspection of sub-surface optical defects in the SOI layer. It is to be understood, of course, that various other techniques may be used and developed in the future to identify and inspect SOI wafers for these sub-surface optical defects. It is to be noted that optical defects with similar dimensions may result in different degree of streaking, as a function of the thickness of the SOI layer and the wavelength used for the optical device. It is expected that any defect having a dimension on the order of a predetermined fraction (e.g. $\frac{1}{10}$, $\frac{1}{20}$) of $\lambda_{effective}$ (where $\lambda_{effective}=\lambda_c/n_{effective}$) will affect the optical performance of devices encountering the defect. A defect count may then be defined in terms of a unit area. For example, acceptable levels of defect count may be one defect/cm$^2$, 10 defects/cm$^2$, 100 defects/cm$^2$ etc. Of course, other fractional amounts, waveguide thicknesses and defect counts per unit area may be used to establish criteria for pre-screening of wafers, the above values being considered as exemplary only.

As mentioned above and illustrated in prior art FIG. 1, a conventional MOS device is formed on SOI layer 20 in combination with a gate dielectric 34 and a silicon layer 38 (typically in the form of heavily-doped polysilicon) to form the "gate" of the structure. As the name MOS (metal-oxide-semiconductor) suggests, the gate silicon layer needs to have "metal-like" electrical properties. This is achieved by degenerately doping the polysilicon layer, then forming a silicide layer on the top surface of the gate silicon layer. In contrast, the silicon layer for the optics (hereinafter referred to as the "optical silicon layer") formed on the same SOI substrate can have any structural form (e.g., single crystal silicon, polysilicon or amorphous silicon). The light can be coupled between a waveguide containing only an SOI layer and a waveguide fabricated using a combination of optical silicon layer, gate dielectric and an SOI layer on the same substrate.

An advantage of the approach of the present invention is that an "MOS" equivalent electro-optic structure is obtained in which an optical silicon layer is separated from the SOI layer by a gate dielectric layer. Both the optical silicon layer and the SOI layer can be placed with respect to one another using lithographic processes to optimally confine the light signal in the resultant waveguide. The shape of the optical mode is determined by various properties of the structure, such as the geometry of the layers, the thickness of the layers, the overlap between the optical silicon layer and the SOI layer and the refractive index of each layer. The SOI layer in combination with the gate dielectric and optical silicon layer(s) can be used to guide light and realize both high performance passive optical devices and active electro-optic devices. It is to be noted that the optical silicon layer is required to have significantly different optical and electrical properties as compared with the gate silicon layer of an electrical MOS device. For example, the gate silicon layer of an MOS device is degenerately doped and often silicided to have the lowest possible electrical resistance. The gate silicon layer is also optimized to have a minimum depletion area in the vicinity of the gate dielectric. However, these requirements result in a very high optical loss, rendering this layer useless for the formation of optical devices.

Passive optical devices can be realized using either the SOI layer alone, or a combination of the SOI layer, a dielectric layer and the optical silicon layer. The optical silicon layer used in passive optical devices must exhibit relatively low optical loss, which translates into the optical silicon layer being "dielectric-like", with extremely low doping levels—essentially undoped—(to reduce free carrier absorption), large grain sizes (to reduce grain boundary scattering), smooth surfaces and sidewalls (to reduce surface scattering) and rounded corners (to minimize optical loss due to high optical density points). For active electro-optic devices, the optical silicon layer needs to have "semiconductor-like" properties, with controlled doping levels and high carrier mobility, in addition to large grain sizes, smooth surfaces and sidewalls, and rounded corners.

As mentioned above, the integration of optical devices with SOI-based electronic integrated circuits cannot significantly alter the performance of standard electronic devices in order to leverage the maturity level of the design, manufacturing and cost structures of the conventional integrated circuits. This requires careful selection and optimization of processing time, temperature, environment and material selection for any additional process steps that may be required for the formation of passive optical devices and active electro-optic devices. Preferably, the formation of the optical devices should use as many common steps in common with the formation of electronic devices as possible to reduce the cycle time and minimize process development costs.

Figure 3:
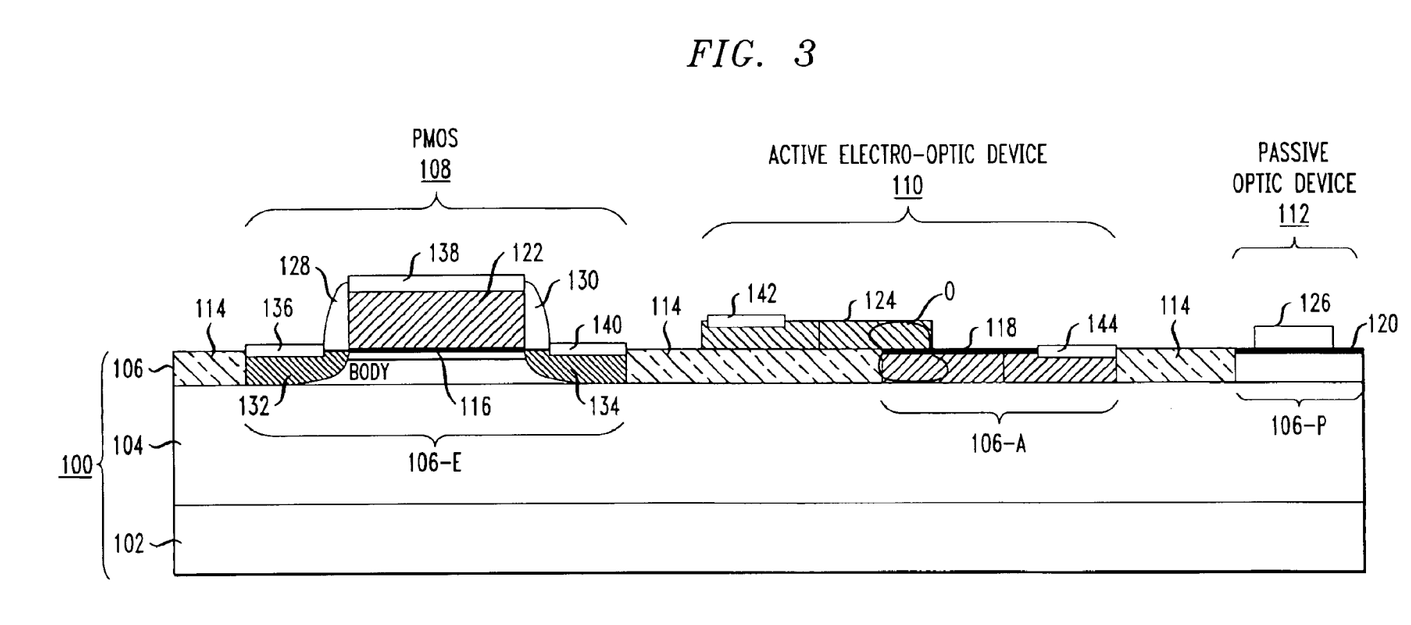
FIG. 3 illustrates an exemplary embodiment of the present invention, illustrating the formation of an electrical PMOS transistor, an active electro-optic device and a passive optical device on a common SOI substrate, utilizing a common surface SOI layer.

An exemplary integration of an electronic device, active electro-optic device and passive optical device, formed in accordance with the present invention, is illustrated in FIG. 3. The integration is formed on a common SOI wafer 100, comprising a silicon substrate 102, buried dielectric layer 104 and surface single crystal silicon layer 106 (the latter referred to hereinafter as "SOI layer 106"). The integration includes a PMOS electrical device 108, an active electro-optic device 110 and passive optical device 112. As discussed above, SOI layer 106 is a common foundational layer for all three types of devices and can be masked and patterned in a single lithography step to define the various regions required for each type of device. If any rounding of the SOI layer in the optical device region is required (as discussed in our co-pending application Ser. No. 10/806,738, filed Mar. 23, 2004), then separate lithography and etching steps can also be used. Referring to FIG. 3, PMOS electrical device 108 will include a portion of SOI layer 106 labeled as "106-E", where an interior portion of region 106-E will form the body and channel of PMOS device 108, and the outer portions of 106-E will be doped with a p+ impurity to form the drain and source regions. A region of SOI layer 106, designated 106-A also remains after patterning and etching, and is used as part of active electro-optical device 110 (where this region may be doped to exhibit either n or p conductivity as required for a specifically desired device). In particular, specifically defined areas within region 106-A may be doped to exhibit certain doping profiles and contact regions to this layer can also be formed by using higher dopant concentrations. Whenever it is possible, it is desirable (however not necessary) to perform some of the doping steps for both optical and electrical devices (such as formation of doping regions for contact) using a common set of masking/ion impanation steps in order to reduce total number of masking steps required for realization of the complete electro-optical integrated circuit. Further, a region of SOI layer 106, designated as 106-P, is shown as forming part of passive optical device 112, such as a waveguide, where region 106-P is preferred to exhibit a very low doping concentration to minimize optical loss. Referring to FIG. 3, a dielectric material 114, such as silicon dioxide, is thereafter formed in all exposed areas to provide electrical isolation between adjacent devices. In some cases, the structure may be re-planarized subsequent to the formation of the isolation regions.

The next sequence of steps (or, perhaps, a single step) is used to form the device dielectric layers, where either a single layer may be formed and used for all three types of devices, or one dielectric layer may be used for the electrical devices and a second dielectric layer used for the optical devices (the differences being in thickness, material choice, or both). In the cases where first and second dielectric layers are formed, it is preferred that the silicon layer for the optical devices is formed over the second dielectric prior to forming the first dielectric layer for the electrical devices. Referring to FIG. 3, PMOS transistor 108 includes an extremely thin gate dielectric layer 116. Silicon dioxide is the most commonly used gate dielectric layer for MOS devices, and is also preferred for optical devices. However several other gate dielectric materials may be used, including, but not limited to, silicon oxynitride, silicon nitride, hafnium oxide and bismuth oxide. It is preferred that relatively thin dielectric layers 118 and 120 are simultaneously formed for active electro-optical device 110 and passive optical device 112, respectively.

In the case where a common dielectric layer is used for all devices, a common layer(s) of silicon may be formed and used as the starting material for each type of device, with different doping levels and profiles used to form the "metal-like" gate silicon layer 122, the "semiconductor-like" active electro-optic device silicon layer 124 and the "dielectric-like" passive optical device silicon layer 126. Alternatively, a separate silicon layer(s) can be used for the optical devices and a separate silicon layer for the electrical devices, where each silicon layer may be formed using a separate set of steps, with the process conditions controlled to form the most favorable conditions for each type of device (e.g., form of silicon used, thickness of layer, doping profile, optical loss properties, etc.). The silicon layer associated with the electrical component gate region is heavily doped to form the "metal-like" gate. The silicon layer associated with the optical devices is selectively doped, as required, to form regions of different conductivities, as needed, to create various regions of optical devices, such as low-doped regions for passive devices and relatively highly doped contact regions and active carrier modulation regions for active devices, etc. Moreover, various forms of silicon may be used for this optical silicon layer, including single crystal silicon, substantially single crystal silicon, amorphous silicon and polysilicon. When used with optical devices, the silicon layer may be further processed to optimize the grain size to reduce optical loss and improve electron-hole mobility (e.g., grain boundary passivated, grain aligned, grain-size enhanced polysilicon). Techniques such as seed crystallization, amorphous deposition, silicon implant and low temperature anneal, silicide seed layer-based crystallization, etc. may be used to improve grain size and electron-hole mobility. The optical silicon layer may be further processed to reduce optical loss—a concern not present in the formation of electrical devices. In particular, a number of separate, thin silicon layers may be used to form the final optical silicon "layer" to provide the desired shape of this layer, the shape being associated with the optical mode confinement required for the device. A number of deposition and lithography/etching steps may be used to generate the desired geometry of the optical silicon layer. With particular reference to the formation of active optical devices, the silicon layer may be formed to partially overlap the SOI layer so that the optical mode peak intensity substantially coincides with the carrier modulation region, defined by the combination of the silicon layer 124, dielectric layer 118 and SOI layer 106-A. The sidewalls of the optical silicon layer forming both active and passive devices may be smoothed, and the corners rounded, as discussed in our co-pending application Ser. No. 10/806,738, filed Mar. 23, 2004, to reduce optical loss. It should be noted that at least some of the passive optical devices may not require the use of any optical silicon and will use only the SOI layer to confine and manipulate the light. Since some of the optical silicon processing steps may require relatively high temperatures, it is considered prudent to form the optical devices prior to forming the electronic devices to prevent unwanted dopant migration in the electronic devices.

In a typical "salicide" (self-aligned silicide) process for forming MOS transistors, a pair of sidewall spacers 128, 130 is formed adjacent to either side of metal-like gate silicon layer 122, where these spacers may comprise silicon nitride, silicon dioxide or other appropriate materials. It should be noted that this process step may result in forming unwanted spacers on the etched sidewalls of the optical device silicon layer (if the optical device silicon layer is defined prior to the formation of the electrical device sidewall spacers). These unwanted spacers can be selectively removed by using a combination of photolithography and conventional isotropic etching techniques. The active drain 132 and source 134 regions of PMOS transistor 108 are then formed by implant, using spacers 128 and 130 to self-align the implant areas. It is to be noted that various conventional techniques and structures are well-known and used in the formation of these device areas, including the use of a lightly-doped drain (LDD) structure, where these techniques are not considered to be germane to the subject matter of the present invention.

The silicide process then continues with the formation of silicide contact areas for each electrical contact location for PMOS transistor 108 and active electro-optical device 110. Referring to FIG. 3, a first silicide contact 136 is formed over drain region 132, a second silicide contact 138 is formed over gate region 122, and a third silicide contact 140 is formed over source region 134. For active electro-optical device 110, a first silicide contact 142 is formed over a defined contact region of silicon layer 124 and a second silicide contact 144 is formed over a defined contact region of SOI layer 106-A. Either a single silicide formation process can be used for both the electrical and optical devices, or separate processes used for each device type. In either case, various types of silicide may be used, such as titanium silicide, tantalum silicide, tungsten silicide, cobalt silicide, nickel silicide or molybdenum silicide. In the case of the optical devices, it is important to maintain the silicide contact areas separated from the optical signal confinement region O, as shown in FIG. 3, in order to minimize optical signal loss (for example, a greater than 0.2 micron separation may be acceptable) and a trade-off may be required between optical loss and speed of operation.

It is a significant aspect of the present invention that the conventional multi-level metallization scheme used for fabrication of high performance SOI-based integrated circuits is used for simultaneously forming various electrical connections to both electrical and optical devices. FIG. 4 illustrates the next steps in the multi-level metallization process, the "metallization" steps including depositing a relatively thick dielectric layer over the wafer surface, opening contacts (which are then processed to be conductive) to the various contact regions, forming a first layer of metal with contacts to the contact regions, as well as forming metal line conductors, the metal line conductors interconnected as required over the dielectric layer. A second dielectric layer(s) is then formed, followed by forming a set of via openings, a second metal layer including electrical connection to various regions of the first metal layer, as defined by the via openings, as well as forming second level metal line conductors. A similar process is repeated, with the final structure thus exhibiting (if required) a "multi-level" metallization arrangement, as shown in FIG. 4. In the arrangement of FIG. 4, a first thick dielectric layer 150 is formed to completely cover the wafer, with a plurality of contacts opened and metallized to reach each separate silicide contact. That is, a plurality of conductive contacts 152, 154, 156, 158 and 160 are formed, as shown, to contact silicide regions 136, 138, 140 of PMOS transistor 108, and silicide regions 142 and 144 of active electro-optic device 110, respectively. A set of first-level metal line conductors 162, 164, 166, 168 and 170 are also formed (indicated as the first-level metal by the term "M–1"). A second level of dielectric layer(s) 172 is then formed over this structure, with a set of metallized via openings 174, 176, 178 and 180 formed as shown in FIG. 4. A second level of metal contacts 182, 184 and 186 is then formed, with the process of insulation/vias/contacts repeated as many times as necessary. Advantageously and in accordance with the present invention, the same processing steps for formation of the dielectric layers, via openings, contact openings, as well as the same metal layers, are used to form the electrical connections for both the electrical devices and active electro-optic devices. For the electro-optic devices, it is preferred to maintain a predetermined separation between the metal layers and the optical confinement region to minimize optical loss. It is envisioned that design rules will be developed for ensuring that a sufficient separation is maintained. For example, cross-over of the first metal layer on the optical confinement region may be prohibited by the design rules.

Figure 5:
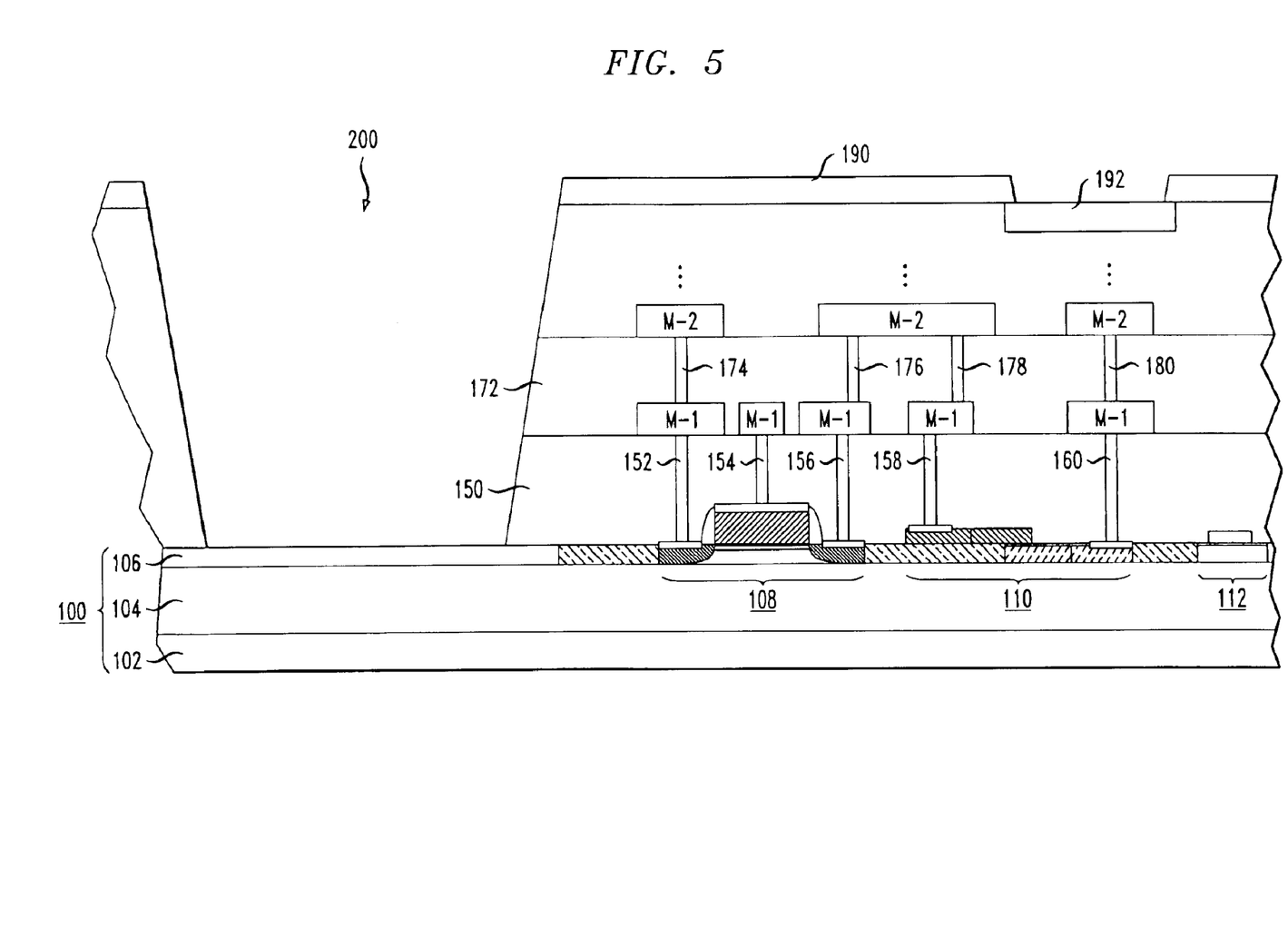
FIG. 5 is an illustration of a final, exemplary structure, including an opening through the metal and dielectric layers to expose a region of the SOI layer for providing coupling of an external optical signal to a waveguide region within the SOI layer.

At the completion of the metallization process, as shown in FIG. 5, a passivation layer 190 is formed (for example, silicon nitride) and patterned to form openings for bondpad locations 192. It is a significant aspect of the present invention that well-developed bonding and packaging schemes of IC manufacturing are used to provide connections to both the electrical and active optical devices. After the formation of bondpad locations 192, a "window" 200 is opened through the entire structure down to SOI layer 106 to form the optical coupling area, that is, an area where a free space optical signal may be coupled into or out of an optical waveguide formed within SOI layer 106. In order for this coupling to be successful, the etching process used to open the structure must leave an "atomically smooth" surface on SOI layer 106 (smooth to within 3–4 Å rms) to allow for the proper physical contact of an evanescent coupling device (e.g., prism, grating, etc—not shown) to SOI layer 106. One such exemplary arrangement capable of providing this type of evanescent coupling is disclosed in our co-pending application Ser. No. 10/668,947, filed Sep. 23, 2003. The opening of window 200 can be accomplished using a single photolithography/etch step, or can be combined with several photolithography/etch steps (for example, combining a photolithography/etch step with steps related to bondpad opening, via opening, and/or contact opening). A portion of the window opening process may be based on the use of wet chemical etching.

It is to be understood that the above-described embodiments of the present invention are considered to be exemplary only, and should not be considered to define or limit the scope of the present invention, as defined by the claims appended hereto:

What is claimed is:

1. An SOI-based electro-optic arrangement comprising
   a silicon substrate;
   a buried dielectric layer;
   a single crystal silicon (SOI) layer disposed over the buried dielectric layer;
   at least one optical component area including
      a thin dielectric layer disposed over a portion of the SOI layer; and
      a silicon layer disposed over the thin dielectric layer so as to overlap in part the SOI layer; and
   at least one electrical component area including
      a thin dielectric layer disposed over a separate portion of the SOI layer; and
      a heavily-doped gate metal-like silicon layer disposed over the thin dielectric layer, wherein one or more optical devices are formed in each of the optical component areas and one or more electrical devices are formed in each of the electrical component areas; and
   a common electrical interconnect arrangement including one or more layers of metallization.

2. The SOI-based arrangement as defined in claim 1 wherein the buried dielectric layer comprises silicon dioxide.

3. The SOI-based arrangement as defined in claim 2 wherein the thickness of the silicon dioxide layer is greater than 0.4 µm.

4. The SOI-based arrangement as defined in claim 1 wherein the thickness of the single crystal silicon layer is less than one micron.

5. The SOI-based arrangement as defined in claim 1 wherein the silicon layer in the at least one optical component area has a thickness less than one micron.

6. The SOI-based arrangement as defined in claim 1 wherein the silicon layer in the at least one optical component area has a thickness substantially equal to the thickness of the heavily-doped gate metal-like silicon layer in the at least one electrical component area.

7. The SOI-based arrangement as defined in claim 1 wherein the silicon layer in the at least one optical component area has a thickness less than the thickness of the heavily-doped gate metal-like silicon layer in the at least one electrical component area.

8. The SOI-based arrangement as defined in claim 1 wherein the silicon layer in the at least one optical component area has a thickness greater than the thickness of the heavily-doped gate metal-like silicon layer in the at least one electrical component area.

9. The SOI-based arrangement as defined in claim 1 wherein the thickness of the silicon layer in the at least one optical component area is chosen to confine the optical mode peak intensity to substantially overlap the carrier modulation region.

10. The SOI-based arrangement as defined in claim 1 wherein the thin dielectric layer in the at least one optical component area has a thickness less than 1000 Å.

11. The SOI-based arrangement as defined in claim 1 wherein the thin dielectric layer in the at least one optical component area is chosen from the group consisting of silicon dioxide, silicon nitride, silicon oxynitride, bismuth oxide and hafnium oxide.

12. The SOI-based arrangement as defined in claim 1 wherein the thin dielectric layer in the at least one optical component area has a thickness substantially equal to the thickness of the thin dielectric layer in the at least one electrical component area.

13. The SOI-based arrangement as defined in claim 1 wherein the thin dielectric layer in the at least one optical component area has a thickness less than the thickness of the thin dielectric layer in the at least one electrical component area.

14. The SOI-based arrangement as defined in claim 1 wherein the thin dielectric layer in the at least one optical component area has a thickness greater than the thickness of the thin dielectric layer in the at least one electrical component area.

15. The SOI-based arrangement as defined in claim 1 wherein the silicon layer in the at least one optical component area is selected from the group consisting of single crystal silicon, substantially single crystal silicon, strained silicon, amorphous silicon and polysilicon.

16. The SOI-based arrangement as defined in claim 15 wherein the polysilicon is selected from the group consisting of grain-size-enhanced polysilicon, grain-aligned polysilicon, grain-boundary-passivated polysilicon.

17. The SOI-based arrangement as defined in claim 1 wherein the silicon layer in the at least one optical component area comprises a single layer structure.

18. The SOI-based arrangement as defined in claim 1 wherein the silicon layer in the at least one optical component area comprises a multiple layer structure.

19. The SOI-based arrangement as defined in claim 18 wherein the multiple layer structure comprises more than one form of silicon.

20. The SOI-based arrangement as defined in claim 18 wherein each layer of the multiple layer structure comprises the same form of silicon.

21. The SOI-based arrangement as defined in claim 1 wherein at least one corner of the silicon layer in the at last one optical component area is rounded to reduce optical signal loss.

22. The SOI-based arrangement as defined in claim 1 wherein at least a portion of the silicon layer in the at least one optical component area is doped to form an active "semiconductor-like" optical device region.

23. The SOI-based arrangement as defined in claim 22 wherein the portion of the SOI layer within the at least one active optical device region is doped to exhibit a conductivity type opposite to that of the silicon layer.

24. The SOI-based arrangement as defined in claim 22 wherein each doped portion contains separate regions of low dopant concentration, for modulation of an optical signal and separate regions of high dopant concentration, for application of an electrical operating signal.

25. The SOI-based arrangement as defined in claim 1 wherein at least a portion of the silicon layer in the at least one optical component area is undoped to form a passive optical device region.

26. The SOI-based arrangement as defined in claim 1 wherein the common electrical interconnect arrangement comprises silicide contact areas disposed on both selected ones of the optical component areas and the electrical component areas, the silicide contact areas comprising the same material and formed simultaneously to exhibit an essentially equal thickness.

27. The SOI-based arrangement as defined in claim 26 wherein the contact silicide is selected from the group consisting of: tantalum silicide, titanium silicide, tungsten silicide, cobalt silicide, nickel silicide, and molybdenum silicide.

28. The SOI-based arrangement as defined in claim 1 wherein the common electrical interconnect arrangement comprises contact areas connecting silicide to a first metal layer disposed on both the active optical component areas and the electrical component areas, the contact areas comprising the same material and formed simultaneously.

29. The SOI-based arrangement as defined in claim 1 wherein the common electrical interconnect arrangement comprises at least one layer of metal disposed on both the active optical component areas and the electrical component areas, comprising the same material and formed simultaneously to provide electrical connection between at least one optical device and at least one electrical device.

30. The SOI-based arrangement as defined in claim 1 wherein the common electrical interconnect arrangement comprises at least two layers of metal disposed on both the optical component areas and the electrical component areas interconnected using inter-metal layer connecting vias, comprising the same materials and formed simultaneously.

31. The SOI-based arrangement as defined in claim 1 wherein the minimum distance between any metal layer of the at least one metal layer and a light confining region of the active optical device in the optical area is greater than one micron.

32. The SOI-based arrangement as defined in claim 1 wherein the minimum distance between any silicide layer and a light confining region of the optical device in the optical area is greater than 0.2 micron.

33. The SOI-based arrangement as defined in claim 1 wherein the single crystal silicon layer has an optical defect count of less than a predetermined number of defects/cm$^2$, a defect being defined as an element exhibiting a dimension of greater than a predetermined fraction of the effective wavelength, $\lambda_{\it effective}$, of the light traveling in the SOI layer.

34. The SOI-based arrangement as defined in claim 33 wherein the predetermined number of defects is selected from the group consisting of 1 defect/cm², 10 defects/cm² and 100 defects/cm².

35. The SOI-based arrangement as defined in claim 33 wherein the predetermined fraction of $\lambda_{\it effective}$ is chosen from the group consisting of ⅕, ⅒, ⅟₁₅ and ⅟₂₀.

36. The SOI-based arrangement as defined in claim 1 wherein the single crystal silicon layer has an optical defect count of less than a predetermined number of defects/cm², a defect being defined as an element exhibiting a dimension of greater than a predetermined fraction of the thickness of the SOI layer.

37. The SOI-based arrangement as defined in claim 36 wherein the predetermined number of defects is selected from the group consisting of 1 defect/cm², 10 defects/cm² and 100 defects/cm².

38. The SOI-based arrangement as defined in claim 36 wherein the predetermined fraction of the thickness of the SOI layer is chosen from the group consisting of ½, ⅓, ¼ and ⅕ and ⅒.

39. The SOI-based arrangement as defined in claim 1 wherein the optical defect count is reduced by performing a hydrogen anneal operation prior to depositing the relatively thin dielectric layer over the SOI layer.

40. The SOI-based arrangement as defined in claim 1 wherein the combined thickness of the SOI layer, the dielectric layer and the silicon layer in the at least one optical component area is selected to support the propagation of a single optical mode in the vertical direction.

41. The SOI-based arrangement as defined in claim 1 wherein the SOI layer is formed using an epitaxial growth process to reduce the optical defect density.

42. The SOI-based arrangement as defined in claim 1 wherein a window is opened from the top surface of the arrangement to expose a portion of the SOI layer used to form an optical coupling area.

43. The SOI-based arrangement as defined in claim 42 wherein the final surface of the exposed portion of the SOI layer is atomically smooth.

44. The SOI-based arrangement as defined in claim 42 wherein the optical coupling area provides evanescent coupling of optical signals into and out of the SOI layer.

45. The SOI-based arrangement as defined in claim 42 wherein the window is formed using a single photolithography/etch step.

46. The SOI-based arrangement as defined in claim 42 wherein the window is formed using a plurality of photolithography/etch steps.

* * * * *